United States Patent
Laliberte et al.

(10) Patent No.: US 7,218,250 B2
(45) Date of Patent: May 15, 2007

(54) METHOD AND APPARATUS FOR KEYBOARD CONTROL WITH PROGRAMMABLE DEBOUNCE AND JOG

(75) Inventors: Edward Robert Laliberte, Barboursville, VA (US); William Todd Shelton, Scottsville, VA (US)

(73) Assignee: General Electric Company, Schenectady, NY (US)

( * ) Notice: Subject to any disclaimer, the term of this patent is extended or adjusted under 35 U.S.C. 154(b) by 427 days.

(21) Appl. No.: 10/936,872

(22) Filed: Sep. 9, 2004

(65) Prior Publication Data

US 2006/0049965 A1    Mar. 9, 2006

(51) Int. Cl.
*H03M 11/00* (2006.01)
*H03K 17/94* (2006.01)

(52) U.S. Cl. ............................ 341/24; 341/22; 341/23; 341/26; 341/34; 345/168; 345/169

(58) Field of Classification Search .................. 341/24, 341/26, 20, 34; 345/167, 173; 353/27 A; 369/30.07; 710/66
See application file for complete search history.

(56) References Cited

U.S. PATENT DOCUMENTS

| | | | |
|---|---|---|---|
| 4,121,284 A | | 10/1978 | Hyatt |
| 4,529,281 A | | 7/1985 | DeRoche et al. |
| 4,686,622 A | | 8/1987 | Hyatt |
| 6,529,785 B1 | * | 3/2003 | Keeley ...................... 700/83 |
| 2002/0093885 A1 | * | 7/2002 | Numano et al. ......... 369/30.08 |
| 2002/0163504 A1 | | 11/2002 | Pallakoff |

OTHER PUBLICATIONS

"MM74C922 MM74C923 16-Key Encoder 20-Key Encoder"; Fairchild Semiconductor Corporation, Oct. 1987 Revised Apr. 2001.

* cited by examiner

*Primary Examiner*—Jeffery A. Hofsass
*Assistant Examiner*—Sisay Yacob
(74) *Attorney, Agent, or Firm*—Eugene Hyun, Esq.; Armstrong Teasdale LLP

(57) ABSTRACT

A method for providing debounce and jog control for a keyboard includes loading a first electronic storage register with a value indicative of a debounce period for the keyboard and loading a second electronic storage register with a value indicative of a jog period for the keyboard. The keyboard is scanned for a pressed key, and a signal indicative of the pressed key is debounced. The method further includes providing electronic signals for key status and jog and asserting an interrupt in accordance with the indicated debounce period and the indicated jog period while the debounced signal indicates the pressed key is down. Keys of the keyboard other than the pressed key are prevented from being scanned until the debounced signal indicates that the pressed key has come up.

33 Claims, 7 Drawing Sheets

METHOD AND APPARATUS FOR KEYBOARD CONTROL WITH PROGRAMMABLE DEBOUNCE AND JOG

BACKGROUND OF THE INVENTION

This invention relates generally to methods and apparatus for electronic data entry and more particularly to methods and apparatus for matrix or touch-screen keyboard control.

In at least one known configuration of an industrial controller or computer, a matrix keyboard or matrix touch screen is scanned continuously to determine whether a key has been pressed. This scanning can be done either via software or hardware polling. Whichever type of polling is used, this configuration requires that a debounce period be determined and a debounce algorithm be developed to prevent data from the keyboard from being contaminated with unintended multiple signaling of each keypress. For matrix keyboards and matrix touch screens from different manufacturers, circuit impedance varies. This variable impedance results in variable rise and fall times of make and break signals, thus requiring different debounce periods.

Some industrial applications require support for a "jog" function, i.e., a "jog key" is provided that controls movement of a motor while the "jog" key is held down. In known keyboard control systems that provide a jog function, this function is provided by software that constantly polls the state of the keys on the keyboard. This polling increases the load on the controller and tends to make it less responsive. Also, when a key is held down, the software remains responsive to other keys on the keyboard. If the user or a nearby person happens to press or another key while one key is held down or fumble while attempting to press a particular key, all of the keys that are hit or held down eventually are eventually read by the software program interpreting the input keystrokes. The erroneously activated keys may cause unintended and/or unpredictable consequences in the operation of an industrial device.

BRIEF DESCRIPTION OF THE INVENTION

Some configurations of the present invention therefore provide a method for providing debounce and jog control for a keyboard. The method includes loading a first electronic storage register with a value indicative of a debounce period for the keyboard and loading a second electronic storage register with a value indicative of a jog period for the keyboard. The method further includes scanning the keyboard for a pressed key, debouncing a signal indicative of the pressed key, and providing electronic signals for key status and jog and asserting an interrupt in accordance with the indicated debounce period and the indicated jog period while the debounced signal indicates the pressed key is down. In addition, the method includes preventing keys of the keyboard other than the pressed key from being scanned until the debounced signal indicates that the pressed key has come up.

In another aspect, some configurations of the present invention provide an apparatus for scanning a matrix keyboard. The apparatus includes a programmable register configured to store a value indicative of a debounce time for the keyboard and a programmable register configured to store a value indicative of a jog time for a key of the keyboard. The apparatus is configured to scan the keyboard for a pressed key and debounce a signal indicative of the pressed key. The apparatus is also configured to provide electronic signals for key status and jog and assert an interrupt in accordance with the indicated debounce period and the indicated jog period while the debounced signal indicate that the pressed key is down. The apparatus is further configured to prevent keys of the keyboard other than the pressed key from being scanned until the debounced signal indicates that the pressed key has come up.

In yet another aspect, some configurations of the present invention provide an apparatus for scanning a matrix keyboard. The apparatus includes a first programmable register configured to store a value indicative of a debounce time for the keyboard and a second programmable register configured to store a value indicative of a jog time for a key of the keyboard. The apparatus is configured to scan the keyboard for a pressed key and debounce a signal indicative of the pressed key. The apparatus is further configured to provide electronic signals for key status and jog and assert an interrupt in accordance with the indicated debounce period and the indicated jog period while the debounced signal indicate that the pressed key is down. The apparatus also is configured to prevent keys of the keyboard other than the pressed key from being scanned until the debounced signal indicates that the pressed key has come up, and clock a code for the pressed key into a register and to generate an interrupt if the pressed key is active at the end of the debounce period.

In yet another aspect of the present invention, a data entry apparatus is provided. The data entry apparatus includes a matrix keyboard, a first programmable register configured to store a value indicative of a debounce time for the keyboard, and a second programmable register configured to store a value indicative of a jog time for a key of the keyboard. The apparatus is configured to scan the keyboard for a pressed key and debounce a signal indicative of the pressed key. The apparatus is further configured to provide electronic signals for key status and jog and assert an interrupt in accordance with the indicated debounce period and the indicated jog period while the debounced signal indicate that the pressed key is down, and prevent keys of the keyboard other than the pressed key from being scanned until the debounced signal indicates that the pressed key has come up.

It will be appreciated that configurations of the present invention provide a highly versatile keyboard controller that can be used with a variety manufactures of matrix keyboards and touch screens along with enhancements to improve the performance of an operator interface. Many configurations of the present can be easily programmed to accommodate different keyboards from various manufacturers. Furthermore, spurious operation of an industrial apparatus controlled by a keyboard is made easier to prevent using some configurations of the present invention.

DETAILED DESCRIPTION OF THE INVENTION

Figure 1:
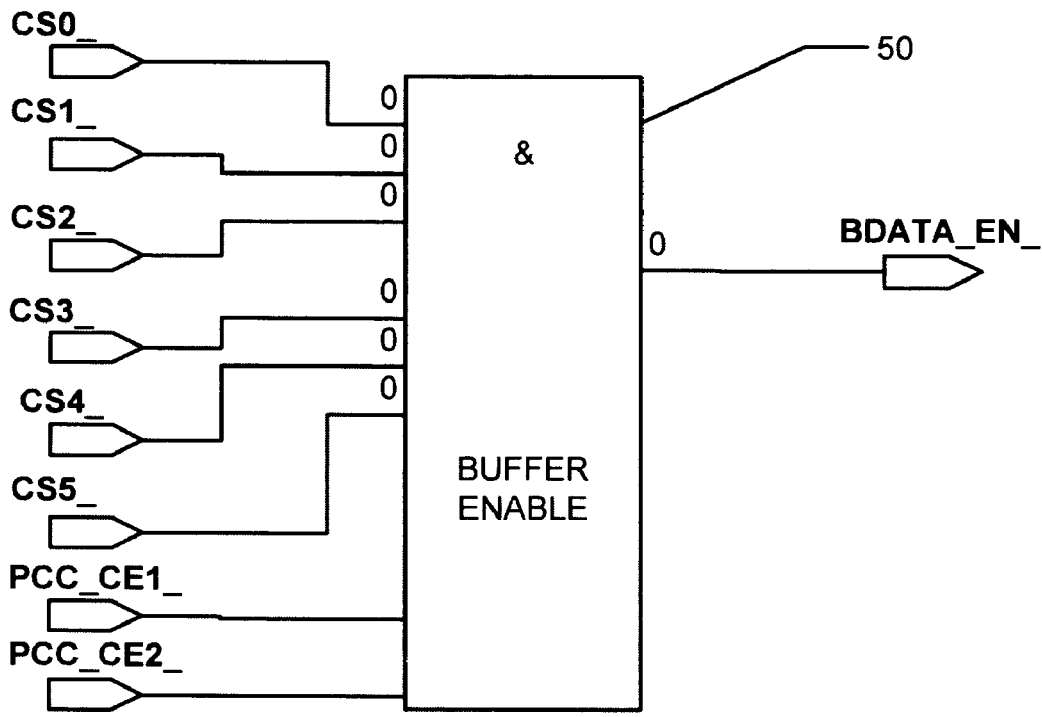
FIG. 1 is a schematic diagram of a data buffer enable logic circuit used in some configurations of the present invention.

Configurations described herein include certain signals described as being "active low" or "active high." Although a choice has to be made for each configuration as to whether these signals are considered "active low" or "active high," that selection is a design choice that can be left to a technician having ordinary skill in the art of digital circuit design. Once the inventive concepts and configurations described herein are understood, the circuit modifications necessary to effectuate the selection of a signal as being "active low" or "active high" can be made by such a technician.

The term "keyboard" is used in the most generic sense herein and includes within its scope any type of switch matrix (of any size) for data entry by fingertip operation, including a "keypad" and a "touch screen." Unless explicitly stated, the terms "keypad" and "keyboard" are used synonymously and interchangeably herein.

The term "matrix keyboard" as used herein also includes within its scope matrix keypads and matrix touch screens.

The term "keypress," "depress" and/or "press" are used herein to refer to the activation of a key with a fingertip, whether or not the key physically moves. For example, a key on a touch screen might be "depressed" without moving perceptibly or at all, yet the activation of a key of a touch screen is included within the scope of the phrase "depressing a key on a keyboard" as used herein.

Also, the terms "first," "second," and "third" are used in many instances herein to distinguish different instances of things or occurrences of a signal, rather than to denote an order of importance, priority, etc. The terms "first interrupt," "second interrupt," and "third interrupt" are used to distinguish three different interrupt assertions without implying whether the three different interrupt assertions occur on the same interrupt line or on a combination of different interrupt lines.

Some configurations of the present invention provide a highly versatile keyboard controller that can be used with a variety manufactures of matrix keyboards and touch screens along with enhancements to improve the performance of an operator interface. The controller is "universal," in that it is programmable to work with different keyboards and touch-screens from different manufacturers. Some configurations of the present invention provide a software-programmable register that controls a programmable debounce period. Once a key has been properly debounced by the hardware, an interrupt is generated. In this manner, a single controller can be used with a variety of keyboards. Technical effects of the present invention include the ability to use a keyboard controller with any of a variety of keyboards having different debounce requirements, and the prevention of suprious operation of industrial systems controlled by the keyboard.

In some configurations, the controller is implemented as hardware in a complex programmable logic device (CPLD) along with other glue logic that is used for the operator interface. One example of a CPLD suitable for some configurations of the present invention is a Xilinx 95288x1-10q144 CPLD. This CPLD provides address decoded chip selects, PCMCIA power logic, and miscellaneous glue logic. Some configurations also include additional GPIO support and keyboard matrix support. Some configurations utilize this programmable logic device with an ARM processor on a CPU motherboard.

A software-programmable register in the CPLD is programmed with a value representing a debounce period of keys on the keyboard. This programmable debounce period allows configurations of the present invention to be easily programmed to accommodate different keyboards from various manufacturers. These keyboards may, for example, have different impedances, necessitating different debounce periods. Selection of a different keyboard thus requires only that the correct debounce period be programmed into a register on start-up of the controller.

Various configurations of the present invention also provide support for a jog function. In some configurations of the present invention, software interprets presses of a jog key to activate a jog function to move a motor. To provide the jog function, interrupts are generated at a fixed interval when the jog key is held down. In some configurations of the present invention, a register is provided that is software-programmable with a value representing an interval between the generation of successive interrupts while the jog key is held down. This feature provides versatility to optimize system performance and control of the jog feature.

For industrial applications, safety is a top concern. To assure the highest level of safety, some configurations of the present invention provide keyboard logic that responds to a first key being pressed and that ignores other keys being pressed until the first key is no longer being pressed. Known keyboards respond to each key that has been pressed in the order in which they have been pressed, making spurious operation of an industrial apparatus more difficult to prevent.

In some configurations, software is used to program a plurality of registers to operate the keyboard logic. A Key Clock Register is set for the proper debounce clock period, which may vary depending upon the keyboard or touch controller being controlled. Also in some configurations, the Key Clock Register is set for the desired jog period. A GPIO/Keypad Source Register is then set for each special key that is used along with a matrix keyboard (GP_KEY_S [0]=1 for Integrated Matrix Keypad Controller, for example). The GPIO Direction Control Register is set as inputs for all keys identified in the GPIO/Keypad Source Register. Also, an Interrupt Mask Register is set to enable an interrupt for all keys identified in the GPIO/Keypad Source Register. Next, KEY_EN (bit 0) of the LED/Key Control Register is set to a 1 to enable the keyboard to start scanning. (More generally, an enable bit of a Key Control Register is activated to enable keyboard scanning. In some configurations, the enable bit is the KEY_EN [bit 0] of the LED/Key Control Register, and this bit is set to 1 to enable scanning.)

After software sets the registers appropriately, the keyboard begins to scan for keys being pressed. The keyboard column scan rate is controlled in some configurations by a 3.6 MHz clock, a 4-bit counter, and a 4-to-16-bit decoder. (The clock speed is not critical to the practice of the present invention, and the number of bits in the counter and decoder can vary dependent upon the intended application. For example, if fewer keys are needed, a keyboard with fewer columns may be provided, which may allow a 2-to-4 bit decoder to be used.) When a key is pressed, nothing happens until the column corresponding to the key being pressed is scanned. When the pressed key is detected, the key is checked to determine whether it is still active after the debounce period. If the pressed key becomes inactive (i.e., is no longer pressed) before the debounce period ends, the keyboard is then scanned for the next key. If the pressed key is still present after the debounce period ends, the 4-bit counter is halted to prevent other keys from being recognized. The KEY_STATE is recorded in the Keypad Status Register. An interrupt is generated once the keycode is recorded in the register. The pressed key will be monitored to see if it comes up before the interrupt is processed. The current status of the key (up or down) is updated in the register. After the software reads the key, the interrupt is cleared and the key continues to be monitored. If the key is still pressed down after the programmed jog period, another interrupt will be generated indicating the key is still pressed down. If the key comes up for the debounce period before the programmed jog period has expired, an interrupt is generated to indicate that the key is up. Once the software reads the key, the interrupt is cleared and the counter is started again to enable the keyboard to scan for the next key. In some configurations, the debounce period is half a period of the programmable keyclock.

In some configurations and referring to Table 1, all CPLD pins are 3.3 V logic level compatible. Pin names that have an underscore ("_") as a final character are considered active low in the example configuration described below. Table 1 provides a further description of signals that are used in some configurations of the present invention.

TABLE 1

CPLD Pin Description

| Signal Name | Type | Description |
| --- | --- | --- |
| RESET_ | I | The system reset line |
| 3M6CLK | I | 3.6 MHz clock output from CPU |
| CS0_ | I | Chip Selects from CPU - used in |
| CS1_ | I | conjunction with address line to |
| CS2_ | I | create the various chip selects |
| CS3_ | I | |
| CS4_ | I | |
| CS5_ | I | |
| A1 | I | Address bus - determines chip |
| A2 | I | select outputs |
| A3 | I | Address bus input - determines |
| A4 | I | CPLD register location |
| A24 | I | |
| A25 | I | |
| PWE_ | I | Peripheral write enable from CPU |
| OE_ | I | Output enable from CPU |
| VIDEO_AS | O | Video Address Strobe |
| BHE0_ | I | Byte enable 0 from CPU |
| BHE1_ | I | Byte enable 1 from CPU |
| BHE2_ | I | Byte enable 2 from CPU |
| BHE3_ | I | Byte enable 3 from CPU |
| WE0_ | O | Write Enable 0 |
| WE1_ | O | Write Enable 1 |
| WE2_ | O | Write Enable 2 |
| WE3_ | O | Write Enable 3 |
| D0 | I/O | Databus |
| D1 | I/O | |
| D2 | I/O | |
| D3 | I/O | |
| D4 | I/O | |
| D5 | I/O | |
| D6 | I/O | |
| D7 | I/O | |
| CSA_ | O | Derived external chip selects - |
| CSB_ | O | See Address |
| CSC_ | O | Decode Table for details |
| CSD_ | O | |
| CSE_ | O | |
| CSF_ | O | |
| CSG_ | O | |
| CSH_ | O | |
| CSI_ | O | |
| CSJ_ | O | |
| CSK_ | O | |
| PCC_PWR0 | O | Power control for PCMCIA - |

TABLE 1-continued

CPLD Pin Description

| Signal Name | Type | Description |
| --- | --- | --- |
| PCC_PWR1 | O | See Maxim MAX1602 specification |
| PCC_PWR2 | O | for bit patterns |
| PCC_PWR3 | O | |
| PCC_VS1_ | I | Voltage Sense Signals |
| PCC_VS2_ | I | |
| PCC_CE1_ | I | PC Card Enable 1 |
| PCC_CE2_ | I | PC Card Enable 2 |
| KPC0 | O | Keyboard Column matrix |
| KPC1 | O | |
| KPC2 | O | |
| KPC3 | O | |
| KPC4 | O | |
| KPC5 | O | |
| KPC6 | O | |
| KPC7 | O | |
| KPC8 | O | |
| KPC9 | O | |
| KPC10 | O | |
| KPC11 | O | |
| KPC12 | O | |
| KPC13 | O | |
| KPC14 | O | |
| KPC15 | O | |
| KPR0 | I | Keyboard Row Matrix |
| KPR1 | I | |
| KPR2 | I | |
| KPR3 | I | |
| KPR4 | I | |
| KPR5 | I | |
| KPR6 | I | |
| KPR7 | I | |
| CONTRAST0 | O | 4-bit contrast adjustment |
| CONTRAST1 | O | for passive displays |
| CONTRAST2 | O | |
| CONTRAST3 | O | |
| BL_ON | O | Turn on the back light |
| DISP_ON | O | Display On - Enable VEE |
| LED_GRN | O | Status Bi-color Green LED control |
| LED_RED | O | Status Bi-color Red LED control |
| GPIO0 | I/O | General Purpose I/O |
| GPIO1 | I/O | |
| GPIO2 | I/O | |
| GPIO3 | I/O | |
| GPIO4 | I/O | |
| GPIO5 | I/O | |
| GPIO6 | I/O | |
| GPIO7 | I/O | |
| CPLD_IRQ | O | CPLD Interrupt to the CPU |
| BDATA_EN_ | O | Enabled whenever CS0_-CS5_or PCC_CE1_-CE2_are active |
| BLMON_1 | I | |
| BLMON_2 | I | |
| BL_FAULT | O | |
| ONE_CCFL | O | |
| 3.3 V | n/a | 3.3 V Power |
| GROUND | n/a | Ground |

CPLD Address Decode

| CS5_ | CS4_ | CS3_ | CS2_ | A25 | A24 | Description |
|---|---|---|---|---|---|---|
| 1 | 1 | 1 | 0 | 0 | 0 | Asserts CSA_—16 MB Lower Chip Select for Battery Backed SRAM |
| 1 | 1 | 1 | 0 | 0 | 1 | CPLD internal registers—16 MB |
| 1 | 1 | 1 | 0 | 1 | 0 | Asserts CSB_—16 MB Middle Chip Select for 16-bit device |
| 1 | 1 | 1 | 0 | 1 | 1 | AssertsCSC_—16 MB UpperChip Select for 16-bit device |
| 1 | 1 | 0 | 1 | 0 | X | Assert CSD_—32 MB Lower Chip Select for Anybus expansion connector |
| 1 | 1 | 0 | 1 | 1 | X | Assert CSE_—32 MB Upper Chip Select for expansion connector |
| 1 | 0 | 1 | 1 | 0 | 0 | Asserts CSF_—16 MB Lower Chip Select |
| 1 | 0 | 1 | 1 | 0 | 1 | Asserts CSG_—16 MB Middle Chip Select |
| 1 | 0 | 1 | 1 | 1 | X | Asserts CSH_—32 MB Upper Chip Select |
| 0 | 1 | 1 | 1 | 0 | 0 | Asserts CSI_—16 MB Lower Chip Select |
| 0 | 1 | 1 | 1 | 0 | 1 | Asserts CSJ_—16 MB Middle Chip Select |
| 0 | 1 | 1 | 1 | 1 | X | Asserts CSK_—32 MB Upper Chip Select |

CPLD Register Descriptions

Some configurations of the present invention provide the registers described below. In an example configuration, bit numbers are shown above the register field and the bit values loaded into the register upon reset are shown below. Also, fields marked undefined will return random values when read.

The example configuration described below requires all registers must be accessed using 16-bit transfers, assuming the CPLD is connected to a 16-bit chip select. However, not all configurations need impose this requirement.

```
Base +0x00    RO         CPLD ID
This register returns the CPLD ID.
          7   6   5   4   3   2   1   0
              CPLD_ID [7:0]
          1   1   0   0   1   1   1   0

Bit         Name              Function

7:0         CPLD_ID           Write=don't care
                              Read=0xCE
Base +0x02    RO         CPLD Revision
This register returns the revision of the CPLD.
          7   6   5   4   3   2   1   0
              VER_REV [7:0]
          0   0   1   1   0   0   0   0

Bit         Name              Function

7:4         CPLD_VER[7:4]     The CPLD Version identifying
                              product that is being used
                              Bit 7  Bit 6  Bit 5  Bit 4   Product
                                0      0      0      0    Reserved 6"
                                0      0      0      1    Reserved 8"
                                0      0      1      0    12" No Keys
                                0      0      1      1    6" with Keys
```

-continued

```
                                0      1      0      0    8" with Keys
                                0      1      0      1    12" with Keys
                                0      1      1      0    64 MB SDRAM
                                0      1      1      1    TBD
                                1      0      0      0    TBD
                                1      0      0      1    TBD
                                1      0      1      0    TBD
                                1      0      1      1    TBD
                                1      1      0      0    TBD
                                1      1      0      1    TBD
                                1      1      1      0    TBD
                                1      1      1      1    TBD
3:0         CPLD_REV[3:0]     Write=don't care
                              Read=rev # for a particular version
Base +0x04    RW         LED/KEY Control
This register controls the software Bi-color (tri-color if both turned on)
LEDs.
          7   6   5   4   3   2   1   0
              LED_Control [7:0]
          0   0   0   0   0   0   0   0

Bit         Name              Function

7           LED_Flash         1=Enable flashing of the LED
                              0=Disable flashing of LED
6:5         Flash_Rate        11=Every 4 seconds
                              10=Every second
                              01=Every half-second
                              00=Keypad Clock "used for debug"
4:3         Unused            Read=00
                              Write=Don't care
2:1         Bi-LED            11=Both RED LED and Green LED are ON (Amber
                              Color)
                              10=Red LED ON and Green LED OFF
                              01=Red LED OFF and Green LED ON
                              00=Both RED LED and Green LED are OFF
0           KEY_EN            1=Enable keypad scanning
                              0=Disable keypad scanning
```

-continued

Base +0x06   RW   Display Control
This register controls the display back light, driving voltage, and contrast voltage.

```
  7   6   5   4   3   2   1   0
 |        LCD_Control [7:0]      |
  0   0   0   0   1   0   0   0
```

| Bit | Name | Function |
|---|---|---|
| 7 | BL_ON | 1=Display back light is ON<br>0=Display back light is OFF |
| 6 | DISP_ON | 1=Display driving voltage is ON<br>0=Display driving voltage is OFF |
| 5 | BL_STAT2 | Read=1 CCFL Back light tube 2 okay<br>Read=0 CCFL Back light tube 2 fail<br>Write=Don't care |
| 4 | BL_STAT1 | Read=1 CCFL Back light tube 1 okay<br>Read=0 CCFL Back light tube 1 fail<br>Write=Don't care |
| 3 | CONTRAST3 | Contrast Voltage Adjustment - MSB |
| 2 | CONTRAST2 | Contrast Voltage Adjustment |
| 1 | CONTRAST1 | Contrast Voltage Adjustment |
| 0 | CONTRAST0 | Contrast Voltage Adjustment - LSB |

Base +0x08   RW   PCMCIA Power Control
This register controls the voltage rails applied to the PCMCIA connector.

```
  7   6   5   4   3   2   1   0
 |        PCC_PWR [7:0]          |
  X   X   0   0   0   0   0   0
```

| Bit | Name | Function |
|---|---|---|
| 7 | VS2 | PCMCIA Voltage Sense 1 & 2 (Read Only) |
| 6 | VS1 | Read=Value of the pin<br>Write=Don't care |
| 5:4 | Unused | Read=00<br>Write=Don't care |
| 3:0 | PCC_PWR[3:0] | PCMCIA power control |

| Bit 3 | Bit 2 | Bit 1 | Bit 0 | VCC | VPP | Mode |
|---|---|---|---|---|---|---|
| 0 | 0 | 0 | 0 | Hi-Z | Hi-Z | Standby |
| 0 | 0 | 0 | 1 | Hi-Z | Hi-Z | Standby |
| 0 | 0 | 1 | 0 | Hi-Z | Hi-Z | Standby |
| 0 | 0 | 1 | 1 | Hi-Z | Hi-Z | Standby |
| 0 | 1 | 0 | 0 | 5V | GND | Active |
| 0 | 1 | 0 | 1 | 5V | 5V | Active |
| 0 | 1 | 1 | 0 | 5V | 12V | Active |
| 0 | 1 | 1 | 1 | 5V | Hi-Z | Active |
| 1 | 0 | 0 | 0 | 3.3V | GND | Active |
| 1 | 0 | 0 | 1 | 3.3V | 3.3V | Active |
| 1 | 0 | 1 | 0 | 3.3V | 12V | Active |
| 1 | 0 | 1 | 1 | 3.3V | Hi-Z | Active |
| 1 | 1 | 0 | 0 | GND | GND | Standby |
| 1 | 1 | 0 | 1 | GND | GND | Standby |
| 1 | 1 | 1 | 0 | GND | GND | Standby |
| 1 | 1 | 1 | 1 | GND | GND | Standby |

Base +0x0A   WO   GPIO/Keypad Source Register
In some configurations, this Write Only register must be set at initial power-up by the boot software to identify whether the GPIO will be used as a keyboard.

```
  7   6   5   4   3   2   1   0
 |        GP_KEY_S [7:0]         |
  0   0   0   0   0   0   0   0
```

| Bit | Name | Function |
|---|---|---|
| 7 | GP_KEY_S[7] | Identifies the GPIO source and interrupt generation for bit 7<br>1= Keypad Debounced GPIO[7]<br>0= GPIO[7] |
| 6 | GP_KEY_S[6] | Identifies the GPIO source and interrupt generation for bit 6<br>1= Keypad Debounced GPIO[6]<br>0= GPIO[6] |
| 5 | GP_KEY_S[5] | Identifies the GPIO source and interrupt generation for bit 5<br>1= Keypad Debounced GPIO[5]<br>0= GPIO[5] |
| 4 | GP_KEY_S[4] | Identifies the GPIO source and interrupt generation for bit 4<br>1= Keypad Debounced GPIO[4]<br>0= GPIO[4] |
| 3 | GP_KEY_S[3] | Identifies the GPIO source and interrupt generation for bit 3<br>1= Keypad Debounced GPIO[3]<br>0= GPIO[3] |
| 2 | GP_KEY_S[2] | Identifies the GPIO source and interrupt generation for bit 2<br>1= Keypad Debounced GPIO[2]<br>0= GPIO[2] |
| 1 | GP_KEY_S[1] | Identifies the GPIO source and interrupt generation for bit 1<br>1= Keypad Debounced GPIO[1]<br>0= GPIO[1] |
| 0 | GP_KEY_S[0] | Identifies the GPIO source and interrupt generation for bit 0<br>1= Integrated Keypad Controller<br>0= GPIO[0] |

Base +0x0C   RW   GPIO Direction Control
In some configurations, this register controls the direction of the GPIO signals. Also in some configurations, the corresponding GPIO bit register must be preset or clear before enabling the direction register.

```
  7   6   5   4   3   2   1   0
 |         GPIO_DIR [7:0]        |
  0   0   0   0   0   0   0   0
```

| Bit | Name | Function |
|---|---|---|
| 7:0 | GPIO_DIR[7:0] | Controls direction of corresponding bit of GPIO<br>1=output<br>0=input |

Base +0x0E   RW   GPIO Bit Register
This register controls the GPIO bits.

```
  7   6   5   4   3   2   1   0
 |           GPIO [7:0]          |
  0   0   0   0   0   0   0   0
```

| Bit | Name | Function |
|---|---|---|
| 7:0 | GPIO[7:0] | Write=Depending on the corresponding direction bit is setup as an output, the value set in this register will appear on GPIO pin.<br>Read=The debounced value at the pin regardless of the direction |

Base +0x10   RO   Keypad Status Register
This register reports the keyboard status of any keys pressed. In various configurations, this is a read only register and all writes to this register are ignored.

```
  7   6   5   4   3   2   1   0
 |           KS [7:0]            |
  0   0   0   0   0   0   0   0
```

| Bit | Name | Function |
|---|---|---|
| 7 | KEY_STATE | Read Only. Indicates whether the key is up or down<br>1=Key is down<br>0=Key is up |
| 6:3 | KPC[3:0] | Read Only. The encoded 16-bit column address |
| 2:0 | KPR[2:0] | Read Only. The encoded 8-bit row address |

-continued

| | | | | |
|---|---|---|---|---|
| 1 | 1 | 0 | 1 | 7.286 |
| 1 | 1 | 1 | 0 | 14.571 |
| 1 | 1 | 1 | 1 | 29.142 |

Data Buffer Enable Logic

In some configurations of the present invention and referring to FIG. 1, data buffer enable logic 50 comprises an ANDing {DeMorgan logic equivalent to a negative OR} of all six chip selects CS0_, CS1_, CS2_, CS3_, CS4_, CS5_ and the 2 PC Card Enables PCC_CE1_ and PCC_CE2_ to produce the buffer enable signal BDATA_EN_. (Note: To enhance visibility, the symbol "_" is represented by "#" in the Figures.)

Write Enable Logic

Figure 2:
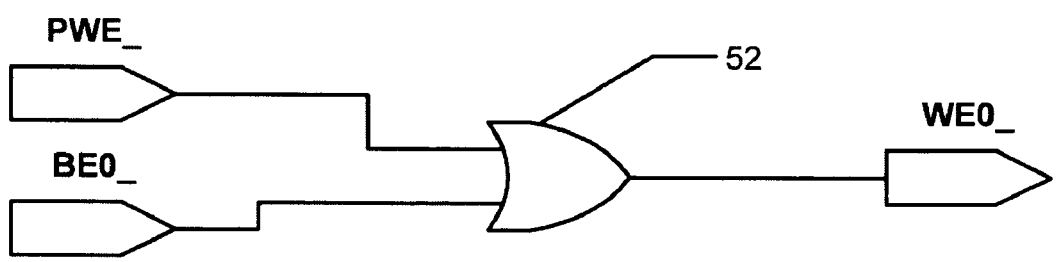
FIG. 2 is a schematic diagram of another logic circuit used in some configurations of the present invention.

Each byte enable is logically ORed {DeMorgan logic equivalent to a negative AND} with PWE_ to create WE0_, WE1_, WE2_, & WE3_. FIG. 2 is a schematic diagram representative of logic 52 used for creating WE0_ using inputs PWE_ and byte enable 0 signal BE0_. Other write enables WE1_, WE2_, and WE3_ are produced using PWE_ and one of signals BE1_, BE2_, and BE3.

GPIO & Interrupt Logic

Figure 3:
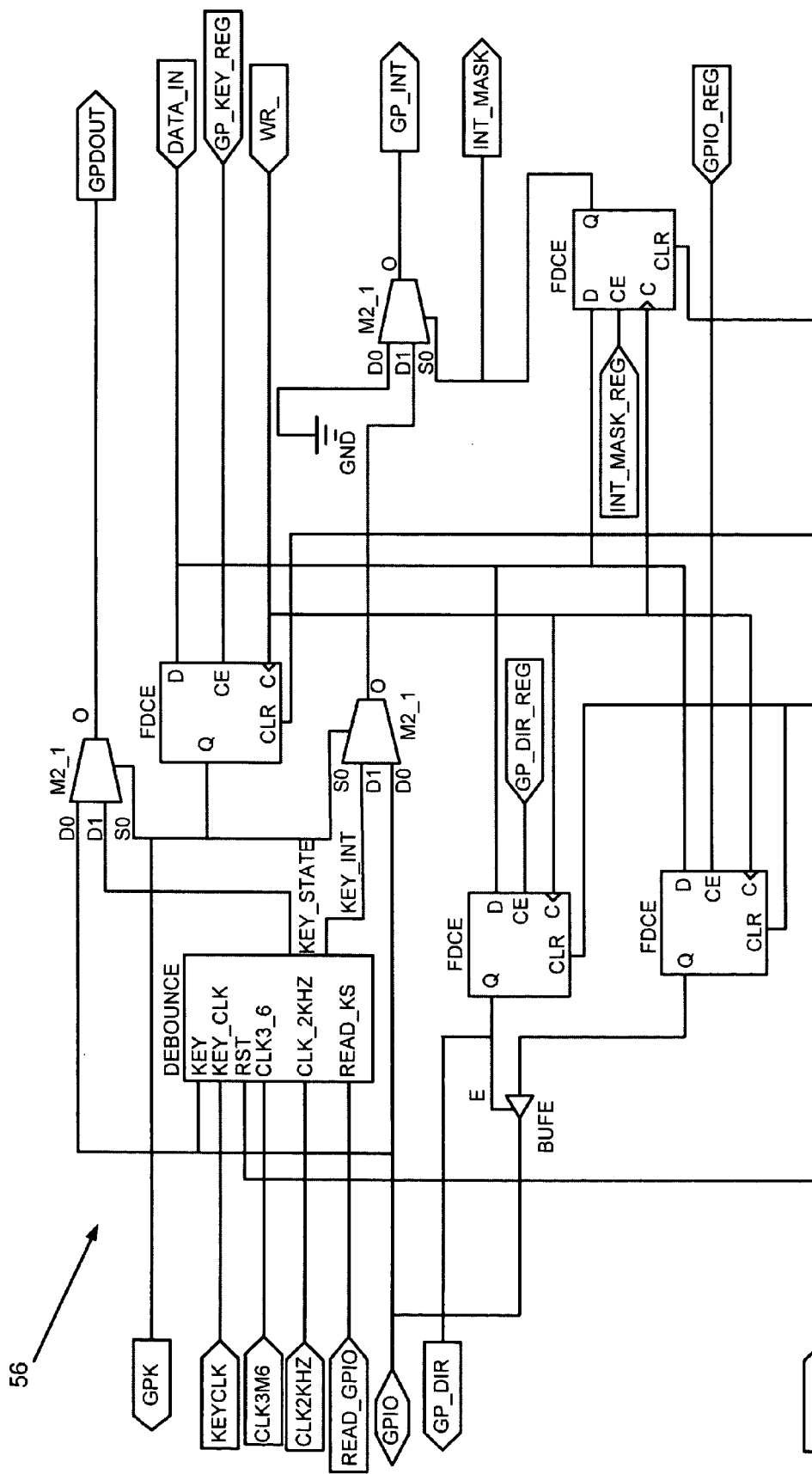
FIG. 3 is a block diagram of a general purpose input/output (GPIO) bit and interrupt logic circuit used in some configurations of the present invention.

To provide flexibility for future expansion, in some configurations, the CPLD includes 8 general purpose I/O lines and a CPU interrupt line. The debounced general purpose I/O has the capability of generating an interrupt to the CPU. Thus, the debounced general purpose I/O provides additional keyboard expansion to allow multiple key presses (a.k.a. Shift & Alt keys). In some configurations, an Interrupt Source Register (ISR) indicates whether the GPIO pin is used for a keyboard. If the ISR for keyboard is set for that I/O line, debounce logic for the corresponding GPIO pin is enabled. The debounce logic asserts GPIO_Key to halt the keyboard scan logic until the firmware reads the ISR. Software is provided in some configurations to process all interrupts identified in the Interrupt Request Register (IRR). In some configurations and referring to FIG. 3, the logic of one of the GPIO bit and interrupt logic is represented by block diagram 56.

Video Address Strobe

Figure 4:
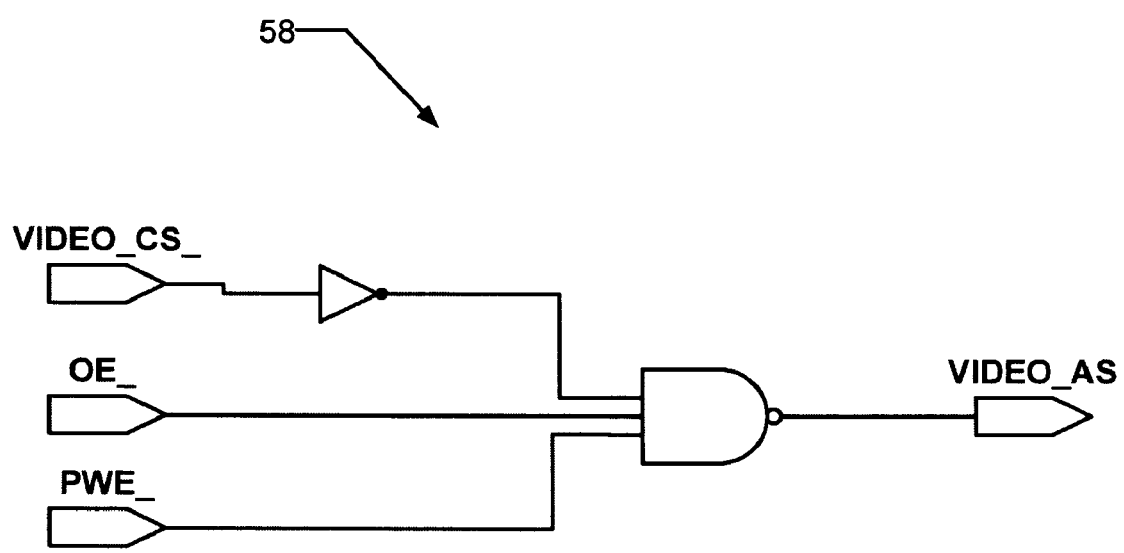
FIG. 4 is a block diagram of a circuit used to generate a video address strobe in some configurations of the present invention.

Some configurations of the present invention utilize a Fujitsu video controller to control a display. This video controller requires an address strobe. The 100 MHz clock glue is provided externally, but the input logic to the DFF is provided in the CPLD to reduce parts on the PWA. In some configurations of the present invention and referring to FIG. 4, logic used to generate the video address strobe is represented by block diagram 58.

Keyboard (or Keypad) Scan Logic

Figure 5:
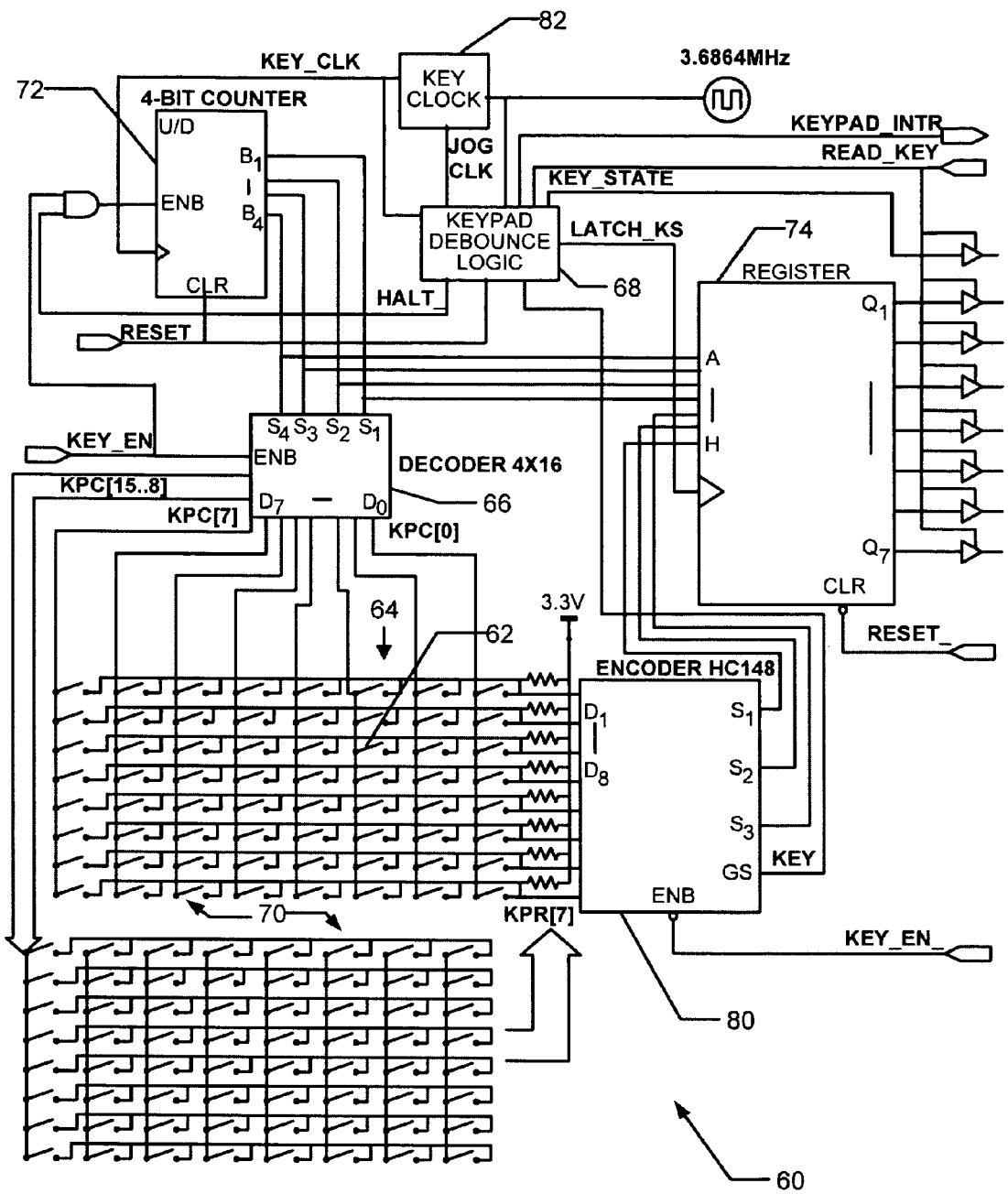
FIG. 5 is a block diagram of a circuit used as a keyboard scan logic circuit in some configurations of the present invention.

The column scan rate is controlled by a clock having a suitable rate (suitable rates include, but are not limited to, rates between 3.4 MHz or 3.6864 MHz, inclusive), a 4-bit counter, and a 4-to-16-bit decoder. For example, schematic diagram 60 in FIG. 5 is representative of keyboard scan logic some configurations of the present invention. Referring to schematic diagram 60, when a key (such as key 62) is pressed, nothing happens until the appropriate column (in this example, column 64) is scanned by decoder 66. Once key 62 is detected by encoder 80, it is checked by keyboard debounce logic circuit 68 to determine whether it is still active after a debounce period. If key 62 becomes inactive before the debounce period has ended, keyboard 70 is scanned for the next key. If key 62 is still active after being debounced, counter 72 is halted and KEY_STATE asserted.

---

Base +0x12 RO Interrupt Request Register
This register indicates the interrupt request. In some configurations, this is a read-only register.

| 7 | 6 | 5 | 4 | 3 | 2 | 1 | 0 |
|---|---|---|---|---|---|---|---|
| | | | INTR_REQ [7:0] | | | | |
| 0 | 0 | 0 | 0 | 0 | 0 | 0 | 0 |

| Bit | Name | Function |
|---|---|---|
| 7:0 | INTR_REQ[7:0] | The corresponding interrupt source will set its bit when the programmed event occurred. The software must read this register to determine what event(s) caused the interrupt to the CPU.<br>1=interrupt request<br>0=no interrupt |

Base +0x14 RW Interrupt Mask Register
This register enables or disables the interrupt signals.

| 7 | 6 | 5 | 4 | 3 | 2 | 1 | 0 |
|---|---|---|---|---|---|---|---|
| | | | INTR_MASK [7:0] | | | | |
| 0 | 0 | 0 | 0 | 0 | 0 | 0 | 0 |

| Bit | Name | Function |
|---|---|---|
| 7:0 | INTR_MASK[7:0] | Determine whether the interrupt source is masked<br>1=Interrupt Enabled<br>0=Interrupt Disabled |

Base +0x16 RW Key Clock Control
This register controls the clock period for the debounce of the key and the clock period for the jog function of a key to generate multiple interrupt when held down.

| 7 | 6 | 5 | 4 | 3 | 2 | 1 | 0 |
|---|---|---|---|---|---|---|---|
| | | | KEY_CLOCK [7:0] | | | | |
| 0 | 0 | 0 | 0 | 0 | 0 | 0 | 0 |

| Bit | Name | Function |
|---|---|---|
| 7:4 | D_CLK[7:4] | Debounce Clock Period - (based on the 3.6864 MHz Clock). |

| Bit 7 | Bit 6 | Bit 5 | Bit 4 | Time Period (s) |
|---|---|---|---|---|
| 0 | 0 | 0 | 0 | 8.69E-07 |
| 0 | 0 | 0 | 1 | 1.74E-06 |
| 0 | 0 | 1 | 0 | 3.47E-06 |
| 0 | 0 | 1 | 1 | 6.95E-06 |
| 0 | 1 | 0 | 0 | 1.39E-05 |
| 0 | 1 | 0 | 1 | 2.78E-05 |
| 0 | 1 | 1 | 0 | 5.56E-05 |
| 0 | 1 | 1 | 1 | 1.11E-04 |
| 1 | 0 | 0 | 0 | 2.22E-04 |
| 1 | 0 | 0 | 1 | 4.45E-04 |
| 1 | 0 | 1 | 0 | 8.89E-04 |
| 1 | 0 | 1 | 1 | 1.78E-03 |
| 1 | 1 | 0 | 0 | 3.56E-03 |
| 1 | 1 | 0 | 1 | 7.11E-03 |
| 1 | 1 | 1 | 0 | 1.42E-02 |
| 1 | 1 | 1 | 1 | 2.85E-02 |

| Bit | Name | Function |
|---|---|---|
| 3:0 | CLK2K[3:0] | Key Clock 2 for the jog period of time between successive interrupts while the key is held down. |

| Bit 3 | Bit 2 | Bit 1 | Bit 0 | Time Period (s) |
|---|---|---|---|---|
| 0 | 0 | 0 | 0 | 0.001 |
| 0 | 0 | 0 | 1 | 0.002 |
| 0 | 0 | 1 | 0 | 0.004 |
| 0 | 0 | 1 | 1 | 0.007 |
| 0 | 1 | 0 | 0 | 0.014 |
| 0 | 1 | 0 | 1 | 0.028 |
| 0 | 1 | 1 | 0 | 0.057 |
| 0 | 1 | 1 | 1 | 0.114 |
| 1 | 0 | 0 | 0 | 0.228 |
| 1 | 0 | 0 | 1 | 0.455 |
| 1 | 0 | 1 | 0 | 0.911 |
| 1 | 0 | 1 | 1 | 1.821 |
| 1 | 1 | 0 | 0 | 3.643 |

The key scan code is latched in the Keypad Status Register, which is included in register 74 in the illustrated configuration. In addition, the current status of KEY_STATE is read in register 74. Once the key scan code is recorded in register 74, an interrupt is generated. Key 62 is then monitored to determine whether it is released before the interrupt is processed. The current status of key 62 pressed or released is updated in the Keypad Status Register. After the software reads key 62, the interrupt is cleared and key 62 continues to be monitored. If key 62 is still pressed after the programmed jog period, another interrupt is generated to indicate that key 62 is still pressed. If key 62 is released for the debounce period before the programmed jog period has expired, an interrupt is generated to indicate that key 62 is no longer active. Once the software reads key 62, the interrupt is cleared and counter 72 is started again for keyboard 70 to scan for the next pressed key. The debounce period is half a period of the programmable keyclock in the Key Clock Control Register 82.

Figure 6:
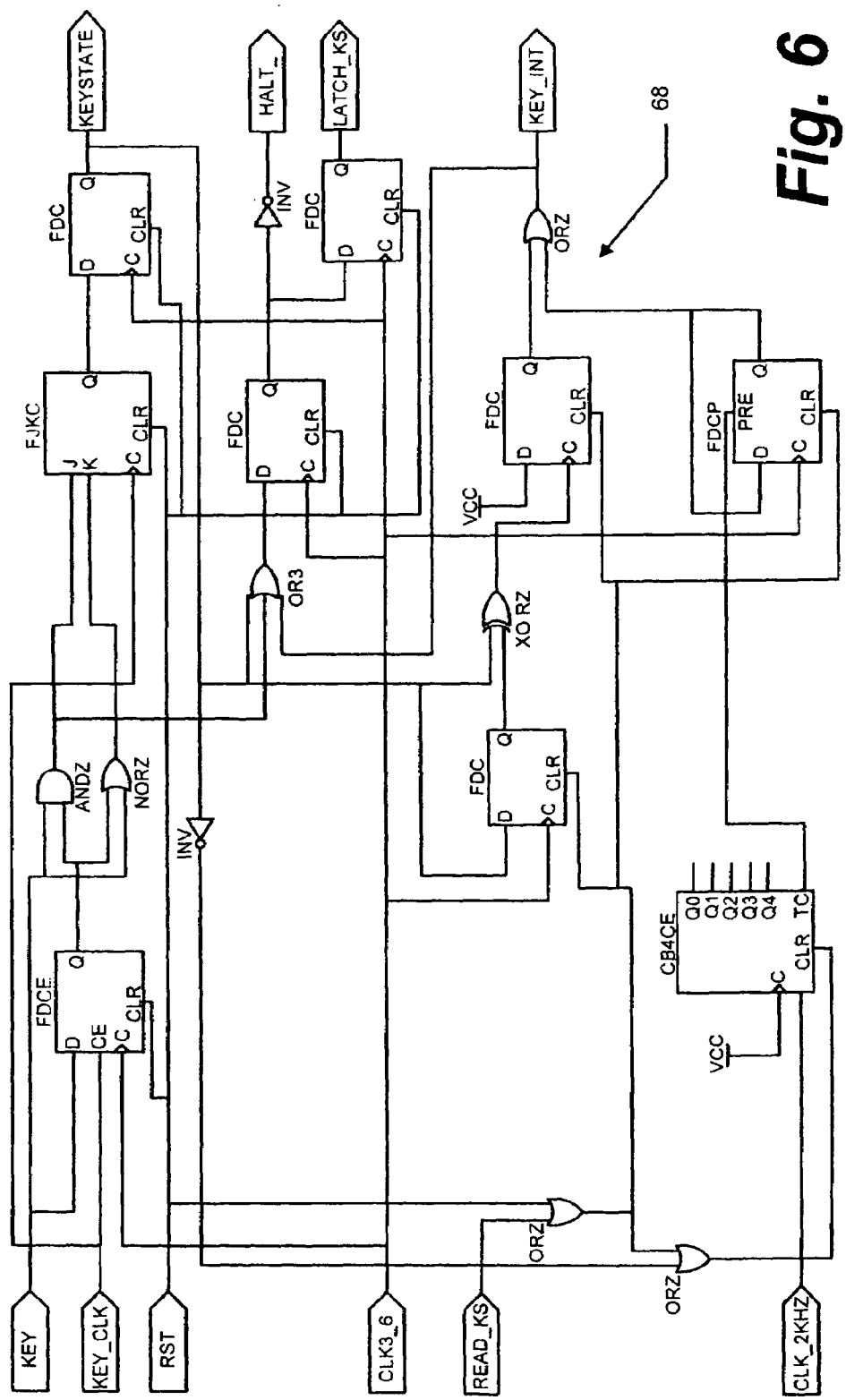
FIG. 6 is a block diagram of a keyboard debounce logic circuit used in some configurations of the present invention.

FIG. 6 is a block diagram of a configuration of keyboard debounce logic 68 used in some configurations of the present invention.

Figure 7A:
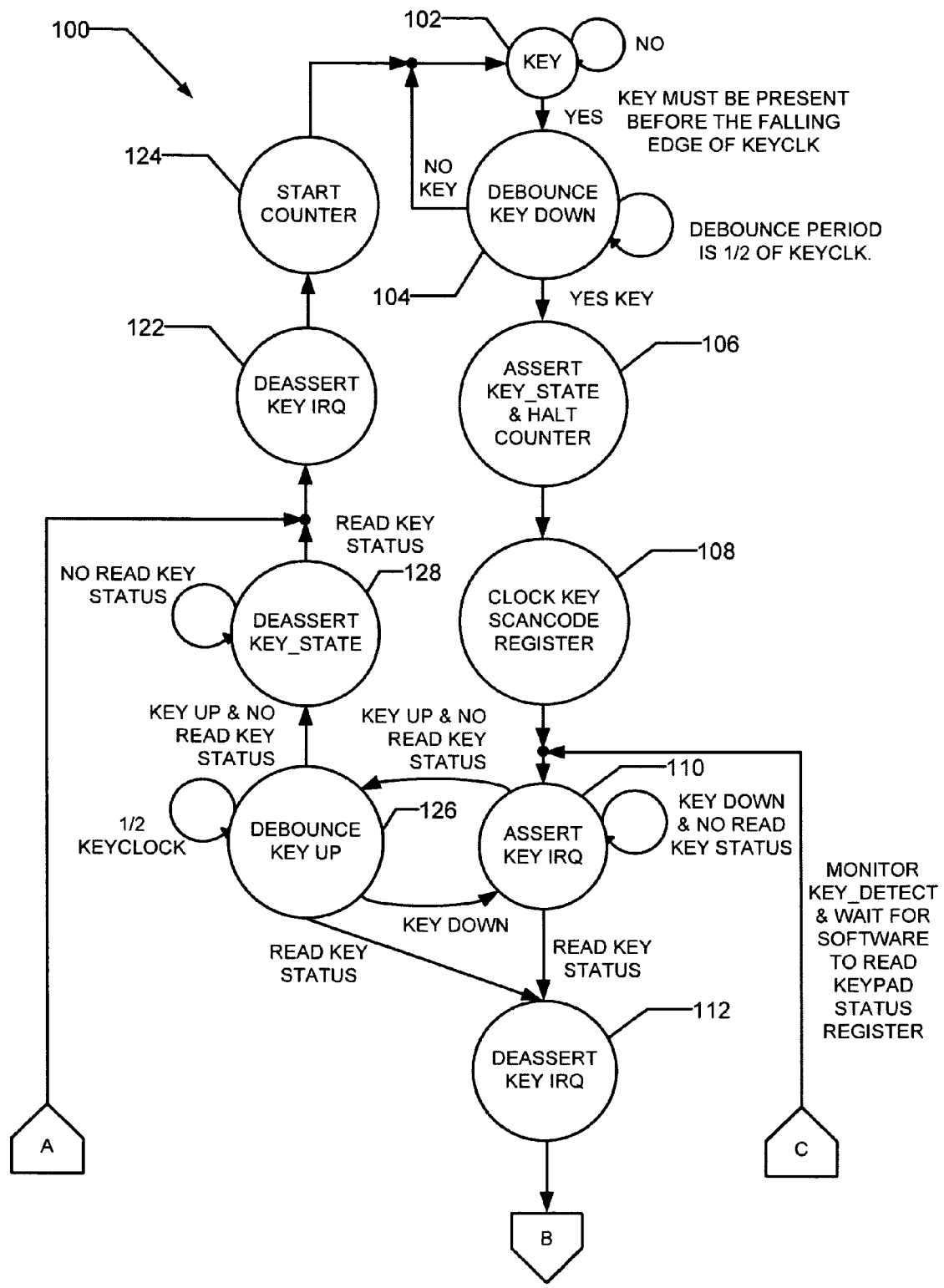
FIG. 7 is a state diagram of state transitions performed by some configurations of the present invention.
Figure 7B:
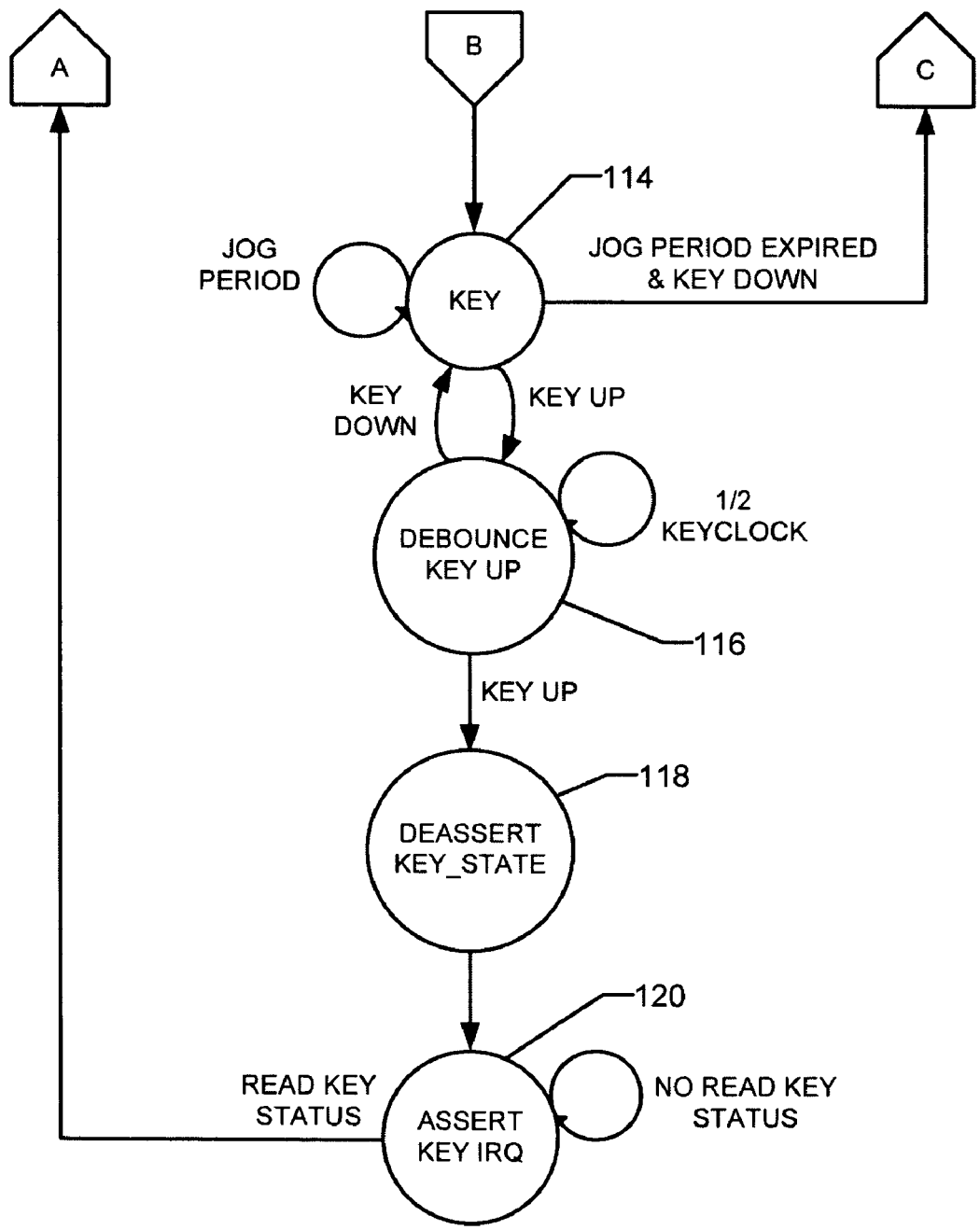

FIG. 7 is a state diagram 100 representing state transitions performed by some configurations of the present invention. A technical effect of the present invention is achieved by first, prior to entering state 102, setting the Key Clock Register for the proper debounce period for the keyboard to which the circuit is connected and electrically responsive. The Key Clock Register is also set for the proper jog period. The GPIO/Keypad Source Register is also set for each individual special key that is used along with the matrix keyboard. The software also sets the GPIO Direction Control Register for all keys identified in the GPIO/Keypad Source Register. Also, the software sets the Interrupt Mask Register to enable the interrupt for all keys identified in the GPIO/Keypad Source Register. Lastly, the software also enables keyboard scanning by setting the KEY_EN bit of the LED/Key Control Register.

After the software sets the registers appropriately, the keyboard begins at state 102 to scan the keyboard for any keys that are being pressed. If no keys are being pressed, the keyboard continues to scan the keyboard at 102. In some configurations, the scan rate for this scanning is controlled by an approximately 3.6 MHz clock, a four-bit counter, and a four-to-sixteen bit decoder. When a key is pressed, nothing happens until the appropriate column is scanned. When a key is detected (i.e., when the key is pressed down and present immediately before the falling edge of the Key Clock), the state changes to 104. At 104, the key is checked for the duration of the programmed debounce period to determine whether the key is still pressed. (The debounce period in some configurations of the present invention is half a period of the programmable keyclock.) If, either immediately after the expiration of the debounce period (or in some configurations, at any time during the debounce period), the key is or becomes inactive (i.e., no longer pressed), the state returns to 102, where the software program waits for another key press. Otherwise, if the key is active at the end of the debounce period (or, in some configurations, throughout the entirety of the debounce period), the counter is halted at 106 to prevent other keys from being recognized. KEY_STATE is also recorded into the Keypad Status Register. The key scan code for the pressed key is clocked into the Keypad Status Register at 108. Once the keycode is recorded in the register, an interrupt is generated at 110. The hardware remains in state 110 as long as the key is down and the key status has not been read by a software program. If the key comes up before the software reads the key status, the pressed key is then monitored at 126 to determine whether the key comes up before the interrupt is processed and the current status of the key up or down is updated. If the pressed key comes up and the software has not read the key status, KEY_STATE is deasserted at 122 and recorded in the Keypad Status Register. When the key status is read, the interrupt is cleared at 122, the counter restarted at 124, and the hardware returns to state 102, waiting for another key to be pressed. If, at state 126, the key returns down, the hardware returns to state 110. If, in either state 110 or 126, the software reads the key status, the hardware transitions to state 112.

After the software reads the key, the interrupt is cleared at 112 and monitoring of the key continues at 114. If the key is still down at 114 when the programmed jog period expires, another interrupt is generated at 110 indicating that the key is still down. If the key comes up before the jog period expires, the key is checked at 116 to determine whether the key remains up for the debounce period. If not, monitoring of the pressed key continues at 114. Otherwise, KEY_STATE is deasserted at 118 and an interrupt is generated at 120 indicating that the key that was pressed is now no longer pressed. Once the software reads the key, the interrupt is cleared at 122 and the counter is started again at 124 for the keyboard to scan for the next key at 102.

If the key comes up for the debounce period before the programmed jog period has expired at 114, an interrupt is generated at 116 indicating that the key is up. Once the software reads the key, the interrupt is cleared at 118 and the key continues to be monitored.

In some configurations of the present invention, not all of the keys in the matrix keyboard jog. A single key, or more than one key, can be selected for jogging by the controller. In configurations in which not all keys jog, the controller is modified to condition entry into a jog state upon recognition that the key pressed is either a preselected jog key, or one of a group of preselected jog keys.

Also, in some configurations of the present invention, one ore more GPIO keys are provided that can be separate from the matrix keyboard. These GPIO keys receive the same programmable debounce and jog as keys of the matrix keyboard, but, when pressed, do not halt the scanning of keys within the matrix. Such GPIO keys can be provided to perform special functions. For example, "Function," "Alternate," "Control," and/or "Shift" keys can be provided in this manner.

It will thus be appreciated that configurations of the present invention provide a highly versatile keyboard controller that can be used with a variety manufactures of matrix keyboards and touch screens along with enhancements to improve the performance of an operator interface. Many configurations of the present can be easily programmed to accommodate different keyboards from various manufacturers. Furthermore, spurious operation of an industrial apparatus controlled by a keyboard is made easier to prevent using some configurations of the present invention.

While the invention has been described in terms of various specific embodiments, those skilled in the art will recognize that the invention can be practiced with modification within the spirit and scope of the claims.

What is claimed is:

1. A method for providing debounce and jog control for a keyboard, said method comprising:

loading a first electronic storage register with a value indicative of a debounce period for the keyboard;

loading a second electronic storage register with a value indicative of a jog period for the keyboard;
scanning the keyboard for a pressed key;
debouncing a signal indicative of the pressed key;
providing electronic signals for key status and jog and asserting an interrupt in accordance with the indicated debounce period and the indicated jog period while the debounced signal indicates the pressed key is down; and
preventing keys of the keyboard other than the pressed key from being scanned until the debounced signal indicates that the pressed key has come up.

2. A method in accordance with claim 1 said wherein preventing keys of the keyboard other than the pressed key from being scanned comprises halting a counter to stop said scanning.

3. A method in accordance with claim 1 wherein the debounce period is half a period of a keyclock.

4. A method for providing debounce and jog control for a keyboard, said method comprising:
loading a first electronic storage register with a value indicative of a debounce period for the keyboard;
loading a second electronic storage register with a value indicative of a jog period for the keyboard;
scanning the keyboard for a pressed key;
debouncing a signal indicative of the pressed key;
providing electronic signals for key status and jog and asserting an interrupt in accordance with the indicated debounce period and the indicated jog period while the debounced signal indicates the pressed key is down;
preventing keys of the keyboard other than the pressed key from being scanned until the debounced signal indicates that the pressed key has come up; and
clocking a code for the pressed key into a register and generating an interrupt if the pressed key is active at the end of the debounce period.

5. A method in accordance with claim 4 wherein said preventing keys of the keyboard other than the pressed key from being scanned for key status, jog, and interrupts until the debounced signal indicates that the pressed key has come up further comprises halting a counter to prevent other keys from being scanned at the end of the debounce period if the pressed key is active at the end of the debounce period.

6. A method in accordance with claim 5 further comprising utilizing software to read a register containing a status of the pressed key and clearing the interrupt when the software reads the key status.

7. A method in accordance with claim 6 further comprising generating a second interrupt signal indicating that the pressed key is still down after the software reads the pressed key when the pressed key is still down after the indicated jog period.

8. A method in accordance with claim 7 further comprising utilizing a debounced key signal for the pressed key to determine whether the pressed key is still down after the indicated jog period.

9. A method in accordance with claim 7 further comprising clearing the second interrupt signal after the software reads the pressed key.

10. A method in accordance with claim 9 further comprising asserting a third interrupt when the pressed key comes up, using software to read the state of the pressed key when the third interrupt is asserted, and, after the third interrupt is asserted and the pressed key is read, subsequently clearing the third interrupt and restarting the counter to allow the keyboard to scan for another pressed key.

11. An apparatus for scanning a matrix keyboard, said apparatus comprising:
a programmable register configured to store a value indicative of a debounce time for the keyboard; and
a programmable register configured to store a value indicative of a jog time for a key of the keyboard; and
said apparatus configured to:
scan the keyboard for a pressed key;
debounce a signal indicative of the pressed key;
provide electronic signals for key status and jog and assert an interrupt in accordance with the indicated debounce period and the indicated jog period while the debounced signal indicate that the pressed key is down; and
prevent keys of the keyboard other than the pressed key from being scanned until the debounced signal indicates that the pressed key has come up.

12. An apparatus in accordance with claim 11 further comprising a counter, and to prevent keys of the keyboard other than the pressed key from being scanned, said apparatus is configured to halt the counter.

13. An apparatus in accordance with claim 11 further comprising a keyclock, and wherein said apparatus is configured with a debounce period of half a keyclock.

14. An apparatus in accordance with claim 11 further configured to debounce and jog one or more GPIO keys and to continue scanning the matrix keyboard while a said GPIO key is pressed.

15. An apparatus for scanning a matrix keyboard, said apparatus comprising:
a first programmable register configured to store a value indicative of a debounce time for the keyboard; and
a second programmable register configured to store a value indicative of a jog time for a key of the keyboard; and
said apparatus configured to:
scan the keyboard for a pressed key;
debounce a signal indicative of the pressed key;
provide electronic signals for key status and jog and assert an interrupt in accordance with the indicated debounce period and the indicated jog period while the debounced signal indicate that the pressed key is down;
prevent keys of the keyboard other than the pressed key from being scanned until the debounced signal indicates that the pressed key has come up; and
clock a code for the pressed key into a register and to generate an interrupt if the pressed key is active at the end of the debounce period.

16. An apparatus in accordance with claim 15 wherein to prevent keys of the keyboard other than the pressed key from being scanned for key status, jog, and interrupts until the debounced signal indicates that the pressed key has come up, said apparatus is further configured to halt a counter to prevent other keys from being scanned at the end of the debounce period if the pressed key is active at the end of the debounce period.

17. An apparatus in accordance with claim 16 further configured to provide clear an interrupt when a register containing a status of the pressed key is read.

18. An apparatus in accordance with claim 17 further configured to generate a second interrupt signal indicating that the pressed key is still down after the pressed key is read, when the pressed key is still down after the indicated jog period.

19. An apparatus in accordance with claim 18 further configured to utilize a debounced key signal for the pressed key to determine whether the pressed key is still down after the indicated jog period.

20. An apparatus in accordance with claim 18 further configured to clear the second interrupt signal after the pressed key is read.

21. An apparatus in accordance with claim 20 further configured to assert a third interrupt when the pressed key comes up, after the third interrupt is asserted and the pressed key is read, subsequently clearing the third interrupt and restarting the counter to allow the keyboard to scan for another pressed key.

22. An apparatus in accordance with claim 15 further configured to debounce and jog one or more GPIO keys and to continue scanning the matrix keyboard while a said GPIO key is pressed.

23. A data entry apparatus comprising:
a matrix keyboard;
a first programmable register configured to store a value indicative of a debounce time for the keyboard; and
a second programmable register configured to store a value indicative of a jog time for a key of the keyboard; and
said apparatus configured to:
scan the keyboard for a pressed key;
debounce a signal indicative of the pressed key;
provide electronic signals for key status and jog and assert an interrupt in accordance with the indicated debounce period and the indicated jog period while the debounced signal indicate that the pressed key is down; and
prevent keys of the keyboard other than the pressed key from being scanned until the debounced signal indicates that the pressed key has come up.

24. An apparatus in accordance with claim 23 further comprising a counter, and to prevent keys of the keyboard other than the pressed key from being scanned, said apparatus is configured to halt the counter.

25. An apparatus in accordance with claim 23 further comprising a keyclock, and wherein said apparatus is configured with a debounce period of half a keyclock.

26. An apparatus in accordance with claim 23 further configured to clock a code for the pressed key into a register and to generate an interrupt if the pressed key is active at the end of the debounce period.

27. An apparatus in accordance with claim 26 wherein to prevent keys of the keyboard other than the pressed key from being scanned for key status, jog, and interrupts until the debounced signal indicates that the pressed key has come up, said apparatus is further configured to halt a counter to prevent other keys from being scanned at the end of the debounce period if the pressed key is active at the end of the debounce period.

28. An apparatus in accordance with claim 27 further configured to provide clear an interrupt when a register containing a status of the pressed key is read.

29. An apparatus in accordance with claim 28 further configured to generate a second interrupt signal indicating that the pressed key is still down after the pressed key is read, when the pressed key is still down after the indicated jog period.

30. An apparatus in accordance with claim 29 further configured to utilize a debounced key signal for the pressed key to determine whether the pressed key is still down after the indicated jog period.

31. An apparatus in accordance with claim 30 further configured to clear the second interrupt signal after the pressed key is read.

32. An apparatus in accordance with claim 31 further configured to assert a third interrupt when the pressed key comes up, after the third interrupt is asserted and the pressed key is read, subsequently clearing the third interrupt and restarting the counter to allow the keyboard to scan for another pressed key.

33. An apparatus in accordance with claim 23 further comprising one or more GPIO keys, and further configured to debounce and jog said one or more GPIO keys and to continue scanning the matrix keyboard while a said GPIO key is pressed.

* * * * *